United States Patent
Mautz

[19]

[11] Patent Number: 5,982,166
[45] Date of Patent: Nov. 9, 1999

[54] METHOD FOR MEASURING A CHARACTERISTIC OF A SEMICONDUCTOR WAFER USING CYLINDRICAL CONTROL

[75] Inventor: Karl Emerson Mautz, Round Rock, Tex.

[73] Assignee: Motorola, Inc., Schaumburg, Ill.

[21] Appl. No.: 08/790,260

[22] Filed: Jan. 27, 1997

[51] Int. Cl.$^6$ .......................... G01R 31/02; G01R 31/28
[52] U.S. Cl. ................................. 324/158.1; 324/765
[58] Field of Search .............................. 324/158.1, 765, 324/754, 758

[56] References Cited

U.S. PATENT DOCUMENTS

| | | | |
|---|---|---|---|
| 4,786,867 | 11/1988 | Yamatsu | 324/765 |
| 5,374,888 | 12/1994 | Karasawa | 324/765 |
| 5,479,108 | 12/1995 | Cheng | 324/765 |

*Primary Examiner*—Ernest Karlsen
*Attorney, Agent, or Firm*—Keith E. Witek

[57] ABSTRACT

The time required to make test measurements across a large diameter wafer, such as a 300 mm wafer, is reduced by using a wafer measuring system that employs theta ($\theta$) and radial (r) control instead of X-Y control. In one embodiment, a measurement arm (14) having a measurement head (16) is positioned over a wafer chuck (18) and a wafer (12) is placed onto the wafer chuck (18). The wafer (12) is then moved to one or more measuring points below the measurement head (16) via theta rotation ($\theta$) and radial positioning. A measurement is then taken at the selected location.

45 Claims, 5 Drawing Sheets

METHOD FOR MEASURING A CHARACTERISTIC OF A SEMICONDUCTOR WAFER USING CYLINDRICAL CONTROL

FIELD OF THE INVENTION

The present invention relates generally to semiconductor wafer testing and metrology, and more particularly to, using a cylindrical coordinate methodology for metrology probing of a semiconductor wafer.

BACKGROUND OF THE INVENTION

In the integrated circuit (IC) industry, semiconductor wafers are measured electrically and/or optically during research, during manufacturing, or after manufacturing to determine various characteristics of either regions or devices on the wafer. Typically, these measurements are made by placing the semiconductor wafer onto a wafer chuck. This wafer chuck is then moved in a three-dimentional manner which requires X axis control, Y axis control, and Z axis control. In order to get accurate results, many X-Y points on the surface of the wafer are measured. Each X-Y location on the wafer requires a change in the X direction and Y direction.

As semiconductor wafers increase in diameter, the use of an X-Y coordinate system to perform these metrology measurements on a semiconductor wafer becomes inefficient. First, the alignment and control required for an X-Y system are sophisticated and are therefore very costly to implement. In addition, the X-Y system requires more fine alignment and control thereby reducing the throughput of a metrology tool. In addition, X and Y motion control results in a significant amount of motion per wafer location. This additional motion may increase maintenance costs or reduce the life of the apparatus as well as reducing the amount of time that the system is actually performing useful work. As wafer sizes increase and the number of measurements per wafer increase, the costs and throughput loss will become even more significant.

Therefore, the need exists for a new metrology methodology which can more efficiently measure larger diameter semiconductor wafers that require many measurement points.

Figure 1:
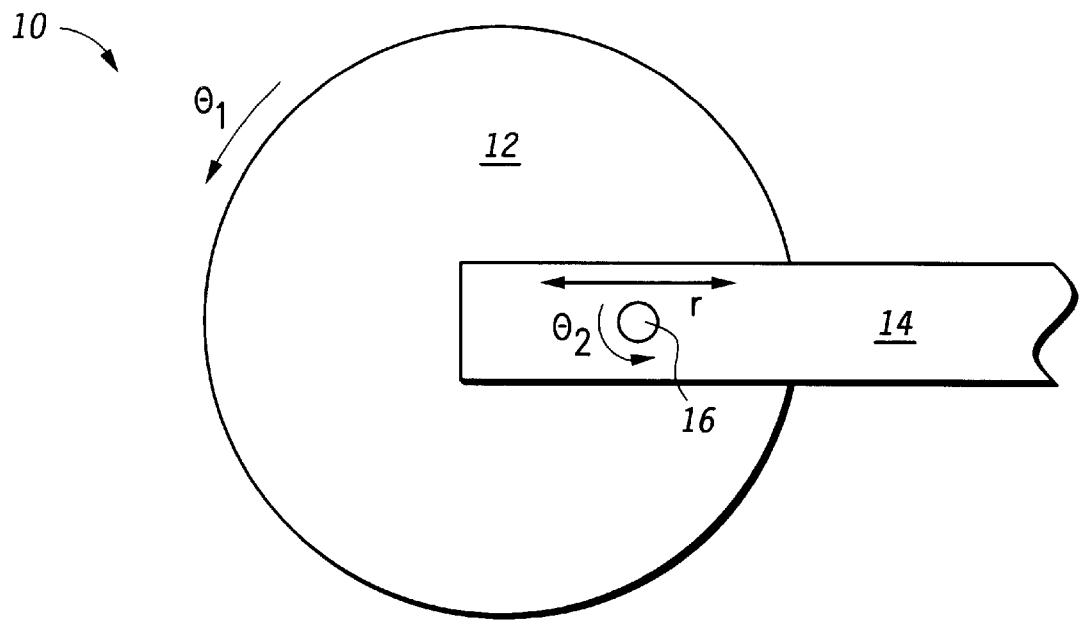
FIG. 1 illustrates, in a top-perspective view, a semiconductor wafer measurement system in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

Description of a Preferred Embodiment

A method is taught herein which allows large diameter semiconductor wafers (greater than 200 mm wafers, such as a 300 mm wafer) to be measured in an efficient manner. Instead of using X-Y coordinate control, the method taught herein uses a cylindrical coordinate control mechanism. Mechanical motors, computers, software, and like control techniques and equipment are used to move a wafer with respect to a measurement head in a theta ($\theta$) direction and radial (r) direction. This cylindrical control can be enabled with less cost, easily maintained, and results in greater throughput through the metrology system. This control can be used to perform precise laser scattering for particle detection, reflection measurement to determine film thickness, electromagnetic radiation for doping concentration measurements, resistivity four-point probing to determine sheet resistance of conductive layers on the wafer, to measure electrical characteristics and functionality of test structures and integrated circuits (ICs), optically measure critical dimensions on an integrated circuits (ICs), and the like.

The invention can be further understood with reference to FIGS. 1–8.

Shown in FIG. 1 is a portion 10 of a measurement system comprising a measurement arm 14 and a measurement head 16. In this embodiment of the invention measurement arm 14 is stationary within the measurement system. Measurement head 16 is free to traverse along the measurement arm 14 in order to take measurements at different radial locations along a radius of wafer 12. In addition, measurement head 16 is designed to rotate in the theta ($\theta$) direction under mechanical and/or electrical control. In the embodiment of FIG. 1, wafer 12 is rotated and the measurement head 16 is positioned above a measurement point on the wafer 12. After positioning at a selected measurement point, measurement head 16 measures a wafer characteristic at the measurement point on the wafer 12. Through the use of theta and radial control via a computer, any point on the wafer or a plurality of points may be measure by the measurement head 16.

For example, measurement head 16 is placed at a first measurement location over wafer 12. The head 16 then makes an electrical or optical measurement at that location. Following this measurement, the wafer 12 is rotated to a new theta coordinate and possibly a new radial coordinate where the head 16 once again takes an electrical or optical measurement at this new location. It should be appreciated that measurement head 16 may be used to make optical or electromagnetic radiation measurements on wafer 12 which require no physical contacting to the wafer 12 (e.g., particle detection, film thickness determination, doping concentration, critical dimension measurement, etc.), or electrical measurements on the surface of the wafer 12 can be taken by contacting the head 16 on the wafer 12 (e.g., test structure probing, resistivity four point probe testing, etc.).

More specifically, measurement head 16 may comprise a laser which can be used to measure particles on wafer 12 using known laser scattering techniques or to measure thin film thicknesses using conventional reflectance techniques or to measure doping concentrations using conventional infrared absorption/transmission techniques. Alternatively, measurement head 16 may comprise a four point probe which can be used to make resistivity measurements. Moreover, measurement head 16 may comprise a probe card which can be used to measure the electrical characteristics and functionality of test structures or integrated circuits (ICs) on wafer 12. Rotational alignment between the head 16 and the site to be measure can be controlled by computer or manual alignment techniques conventionally used in lithographic IC processing.

Figure 2:
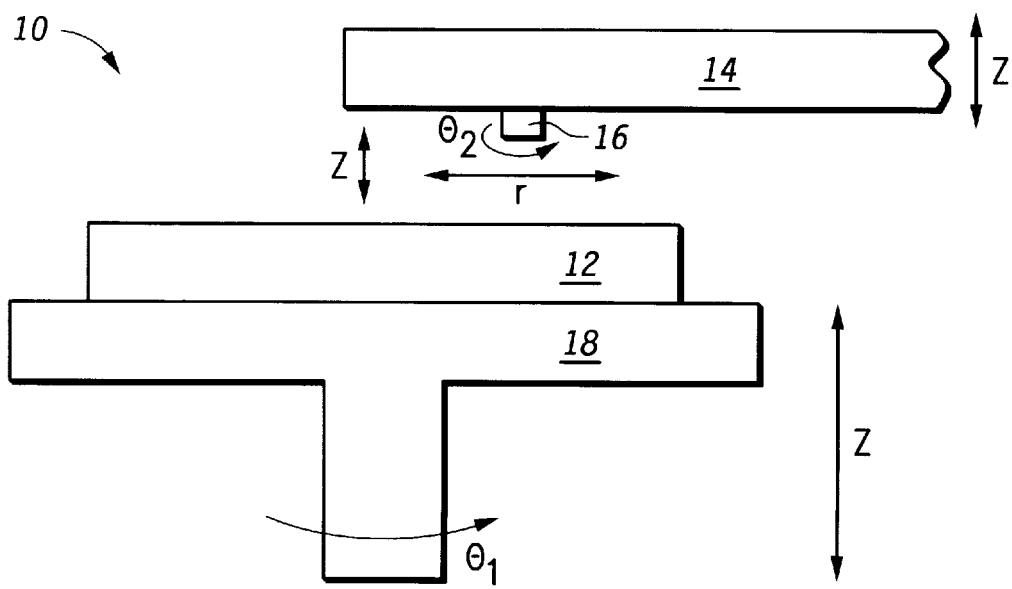
FIG. 2 illustrates, in a cross-sectional view, the semiconductor wafer measurement system of FIG. 1 in accordance with the present invention.

Shown in FIG. 2 is a cross-sectional view of a portion 10 of the measuring system shown in FIG. 1. As shown in FIG. 2 wafer 12 is mounted to wafer chuck 18, such as a vacuum chuck. Wafer chuck 18 is used to rotate wafer 12 in the theta (θ) direction and to move the wafer 12 up and down in the Z direction in order to place wafer 12 in physical contact with measurement head 16 when required. For example, wafer chuck 18 would place wafer 12 in contact with measurement head 16 when measurement head 16 is being used to make a resistivity four-point probe measurement on wafer 12. It should be appreciated that measurement arm 14 and measurement head 16 may also be designed to perform the motion in the Z direction instead of the wafer chuck 18. The movement of measurement arm 14, measurement head 16 and wafer chuck 18 may be accomplished by using well known servo motor control or electrical techniques. Moreover, the movement of measurement arm 14, measurement head 16 and wafer chuck 18 may be controlled by using a computer and motion-control software.

As the wafer is rotated to new measurement points, the orientation of the die under the test head changes. As this orientation changes, the test head 16 must be rotationally aligned to compensate for the orientation change. This rotational consistency can be maintained by rotating the test head 16 in direct computer-coupled relationship with the rotation of the chuck 12. For example, if the wafer rotates 125 degrees off center in the theta direction, then a 125 degrees shift in the head will properly align the head to any underlying test location. It is important to note that not all tests require that the head 16 be rotationally aligned to an underlying site.

Figure 3:
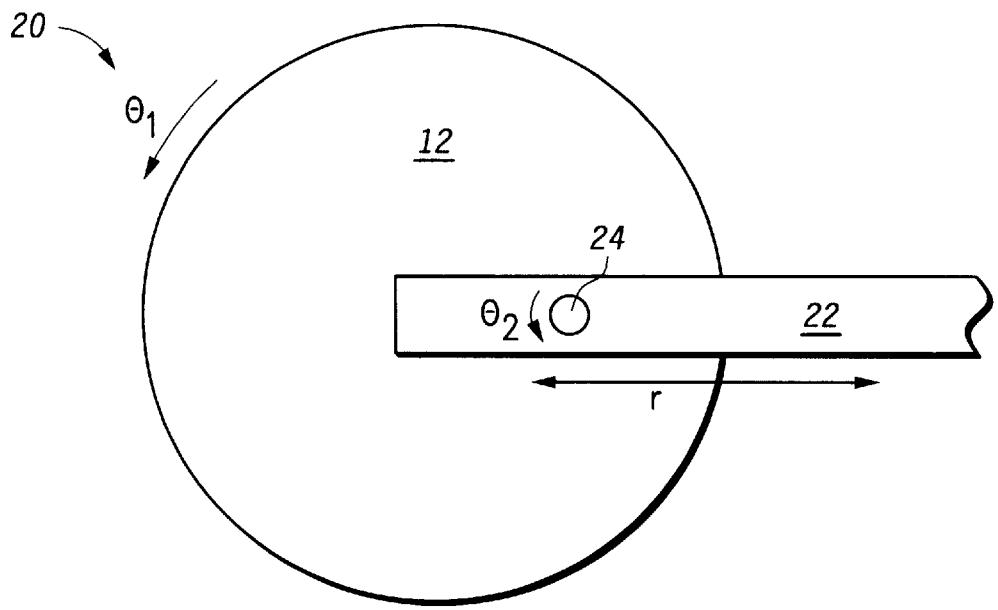
FIG. 3 illustrates, in a cross-sectional view, another semiconductor wafer measurement system in accordance with the present invention.

Shown in FIG. 3 is an alternative embodiment of the present invention. FIG. 3 illustrates a portion 20 of a measurement system comprising a measurement arm 22 and a measurement head 24. In this embodiment of the invention, measurement head 24 is stationary on measurement arm 22, but measurement arm 22 is free to traverse across the radius of wafer 12 so that measurement head 24 may make electrical or optical measurement of wafer 12 at different locations along the radius of wafer 12. Once again, by rotating wafer 12 about its theta (θ) axis and by moving measurement arm 22 along the radius (r) of wafer 12, electrical and/or optical measurements may be made at any location on wafer 12. For reasons previously discussed, measurement head 24 is also designed to be rotated about a theta axis for alignment purposes.

Figure 4:
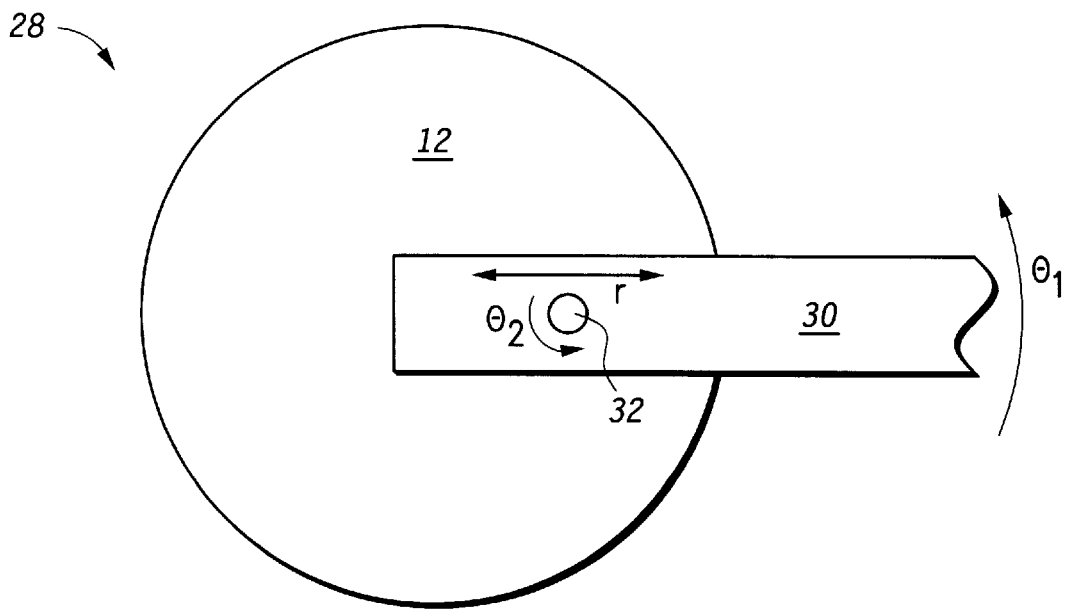
FIG. 4 illustrates, in a cross-sectional view, yet another semiconductor wafer measurement system in accordance with the present invention.

Shown in FIG. 4 is an alternative embodiment of the present invention. FIG. 4 illustrates a portion 28 of a measurement system comprising a measurement arm 30 and a measurement head 32. In this embodiment of the invention wafer 12 is held stationary about its X axis, Y axis and theta (θ) axis. Measurement arm 30 rotates about a theta (θ) axis and measurement head 32 traverses along measurement arm 30 to various locations along the radius (r) of wafer 12. In addition, measurement head 32 is also designed to rotate in a theta direction. In this embodiment measurement arm 30 rotates in a theta (θ) direction about the perimeter of wafer 12 while measurement head 32 performs radial positioning. After positioning, the head 32 takes electrical and/or optical measurements at the selected measurement location of wafer 12. The movement of measurement arm 30 and measurement head 32 allows metrology measurements to be taken at any measurement location on the surface of wafer 12.

Figure 5:
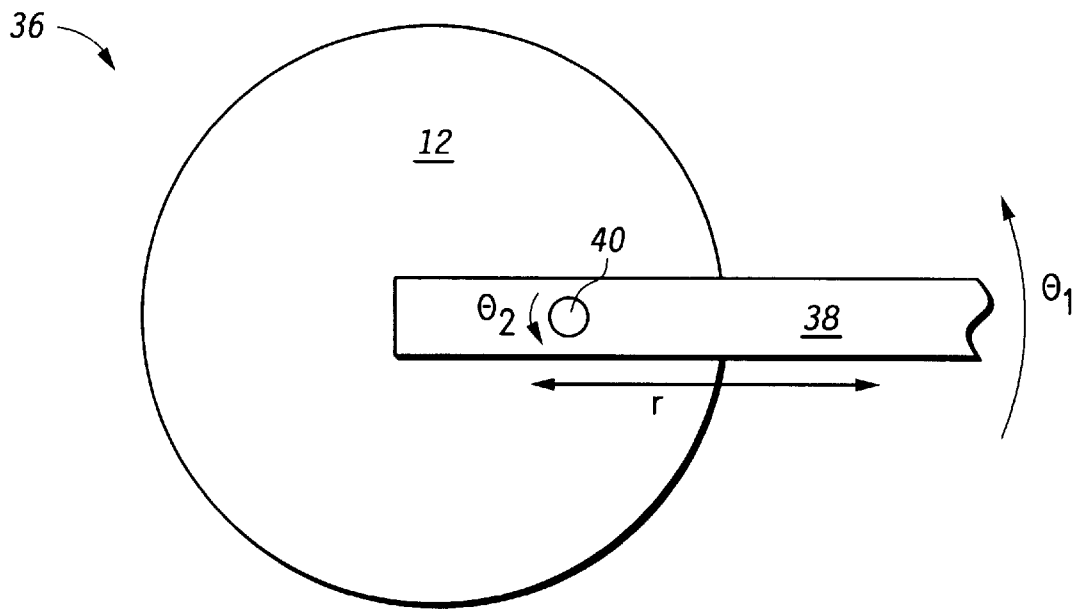
FIG. 5 illustrates, in a cross-sectional view, yet another semiconductor wafer measurement system in accordance with the present invention.

An alternative embodiment of the present invention is shown in FIG. 5. Wherein a portion 36 of a measurement system comprises a measurement arm 38 and a measurement head 40. In this embodiment of the invention measurement head 40 does not perform radial control within the system and instead is held stationary within the measurement arm 38. However, the measurement head 40 rotates in the theta (θ) direction to perform alignment as discussed herein. At the same time that the measurement arm 38 is free to move along a theta (θ) direction along the circumference of wafer 12, the arm 28 is free to extend or retract along a radius of the wafer 12 to enable measurement at any point on the wafer 12. Electrical and/or optical measurements may be made at any location at the surface of wafer 12. In one embodiment, measurement arm 38 is a telescoping mechanical arm which can be made to extend or retract such that measurement head 40 may be positioned at various locations along the radius of wafer 12. In addition, measurement head 40 is also free to rotate in the theta (θ) direction.

Figure 6:
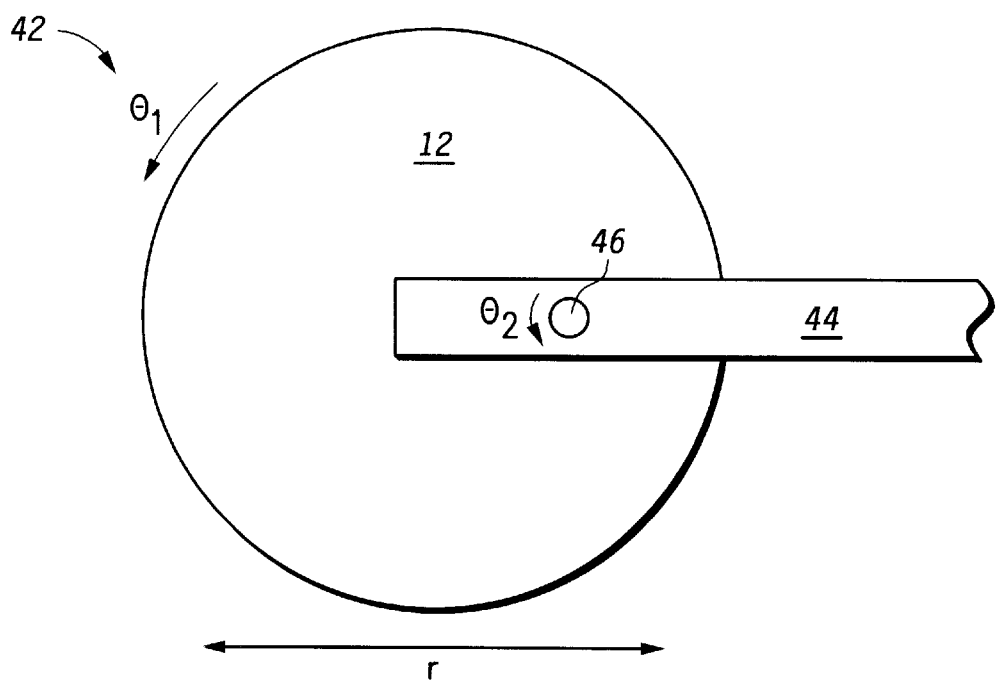
FIG. 6 illustrates, in a cross-sectional view, yet another semiconductor wafer measurement system in accordance with the present invention.

Shown in FIG. 6 is an alternative embodiment of the present invention. In FIG. 6, a portion 42 of the measurement system comprises a measurement arm 44 and a measurement head 46. In this embodiment of the invention, measurement arm 44 and measurement head 46 are held stationary. Instead, in this embodiment, electrical and/or optical measurements on the surface of wafer 12 are accomplished by rotating wafer 12 in the theta direction and by moving wafer 12 along its X axis (also the radial axis r). Measurement head 46 may be located at various radial and theta positions along the surface of wafer 12 so that any point on the wafer 12 may be analyzed. In addition, measurement head 46 is free to rotate in the theta (θ) direction to perform alignment as taught herein.

Figure 7:
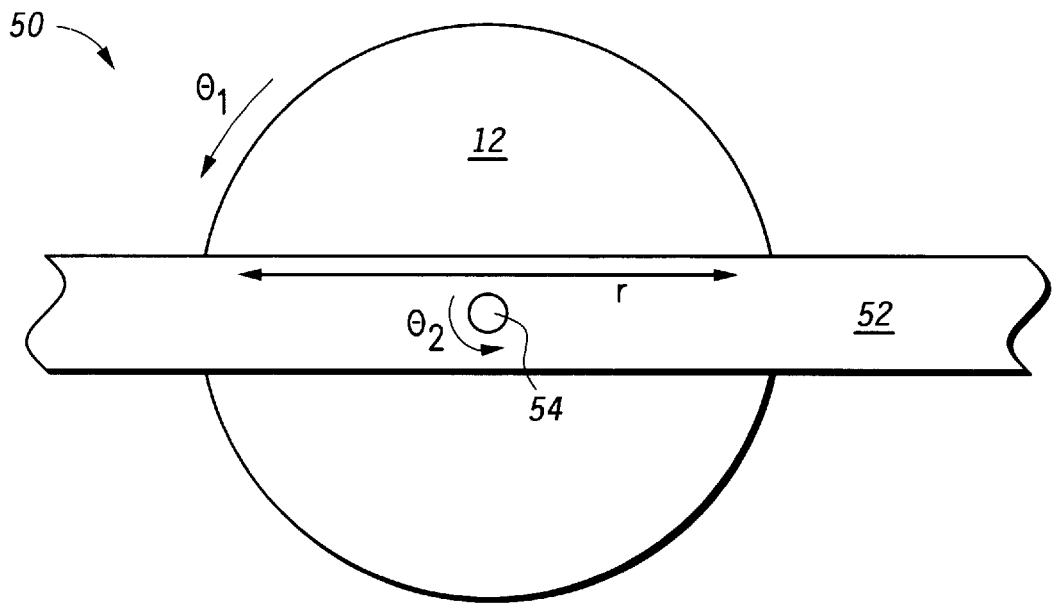
FIG. 7 illustrates, in a cross-sectional view, yet another semiconductor wafer measurement system in accordance with the present invention.

Shown in FIG. 7 is an alternative embodiment of the present invention wherein a portion 50 of a measurement system comprises a measurement arm 52 and a measurement head 54. In this embodiment measurement arm 52 is stationary along its theta (θ) and radial axis (r). However, measurement head 54 is free to traverse along measurement arm 52 such that it can be positioned at various radial locations along the radius of wafer 12. In this embodiment wafer 12 is capable of being rotated in the theta direction. Therefore, measurement head 54 can be positioned at various locations along the surface of wafer 12 so that electrical and/or optical measurements are made at any location on the surface of wafer 12. In addition, as shown in FIG. 7, measurement head 54 is free to rotate about its theta axis to perform alignment as taught herein.

Figure 8:
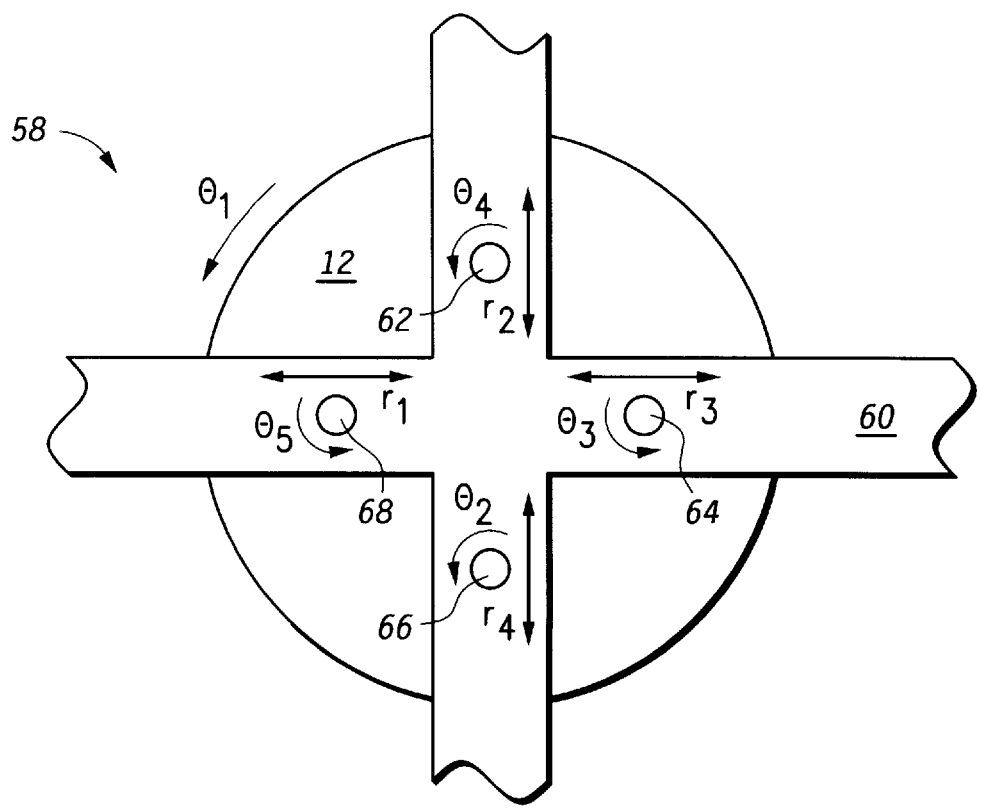
FIG. 8 illustrates, in a cross-sectional view, yet another semiconductor wafer measurement system in accordance with the present invention.

Shown in FIG. 8 is an alternative embodiment of the present invention wherein a portion 58 of a measuring system comprises measurement arm 60 and a plurality of measurement heads 62, 64, 68, and 66. In this embodiment measurement arm 60 has a crosslike structure and is held stationary about the X, Y, and theta axis. Measurement head 64 and 68 are free to traverse along measurement arm 60 in the X radial direction. Measurement heads 62 and 66 are free to traverse along measurement arm 60 in the Y radial direction. In addition, each of the measurement heads 62, 64, 66 and 68 are free to rotate about their theta ($\theta$) axis. In this embodiment, wafer 12 is rotated about its theta ($\theta$) axis while measurement heads 62, 64, 66 and 68 make electrical and/or optical measurements at various locations along the radius of wafer 12. It should be appreciated that measurement head 62 may be used to make a first type of metrology measurement while measurement head 64 may be used to make another type of metrology measurement. In the alternative, each head in FIG. 8 can perform the same metrology measurement so that a wafer can be processed roughly four times faster. Thus, measurement heads 62, 64, 66 and 68 may or may not be functionally equivalent depending upon the metrology needs of the end user.

Figure 9:
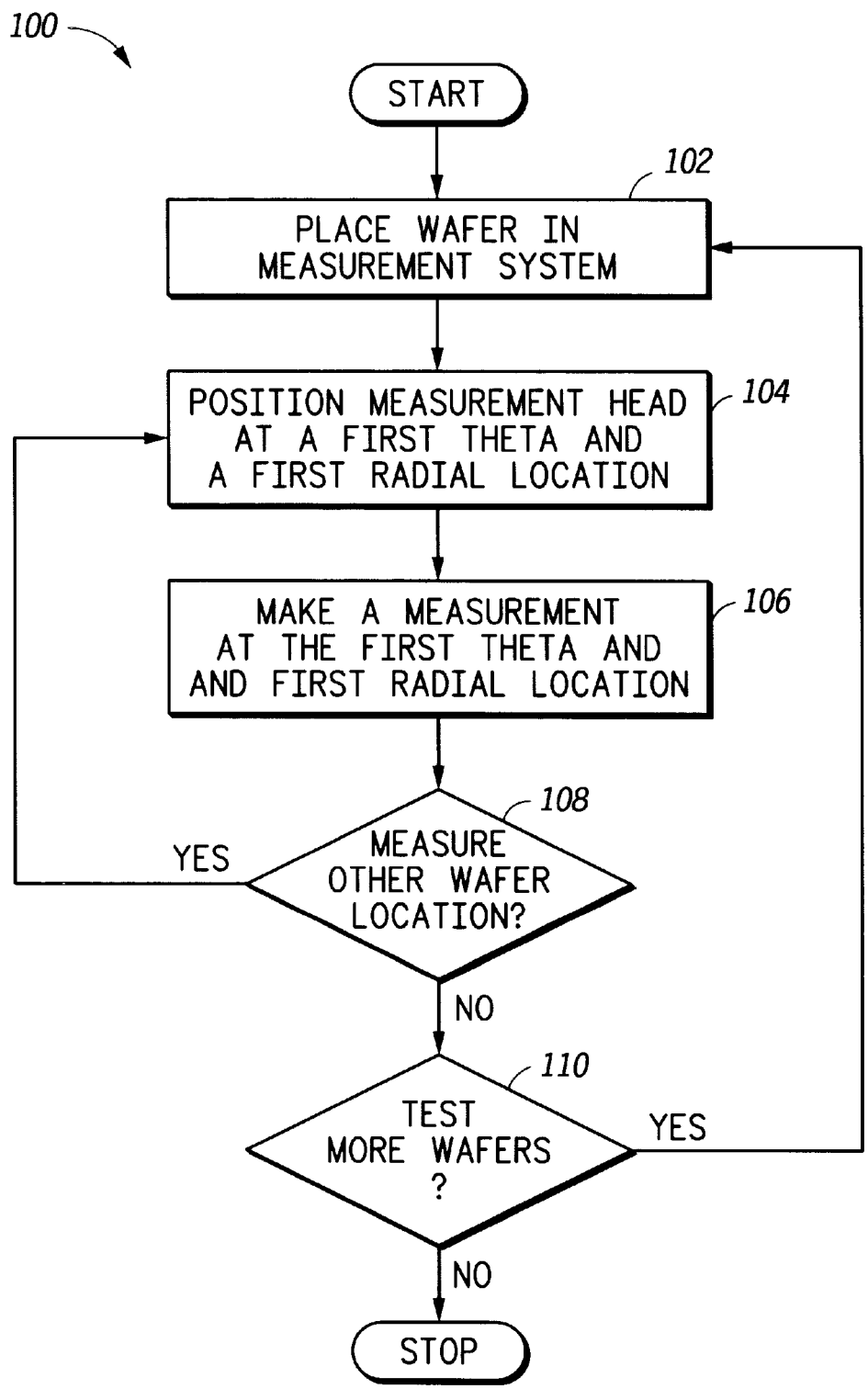
FIG. 9 illustrates, in a flowchart, a method for using the systems taught herein to perform wafer metrology measurements in accordance with the present invention.

Shown in FIG. 9 is a process flow diagram 100 for measuring a wafer in accordance with the present invention. In step 102 a wafer is placed in the measurement system. Then in step 104 the measurement head is positioned at a first theta ($\theta$) location and at a first radial (r) location over the wafer. At step 106 a measurement is then made at this first theta ($\theta$) location and at this first radial (r) location. Next, in step 108, it is determined if another measurement needs to be taken at another location on that wafer. If another measurement needs to be done, then the process loops back up to step 104, if not, the process proceeds to step 110. In step 110, it is determined whether other wafers need to be measured. If more wafers need to be measured, then the process loops back to step 102, if not, the process is ended.

Thus it is apparent that there has been provided, in accordance with the present invention, a method for measuring characteristics of a semiconductor wafer using a cylindrical computer-controlled coordinate system. Although the invention has been described and illustrated with reference to the specific embodiment, it is not intended that the invention be limited to these illustrative embodiments. Those skilled in the art will recognize that modifications and variations may be made with departing from the spirit and scope of the invention. For example, the techniques taught herein may be used to measure and/or test flat panel displays, printed circuit boards, and like substrates in addition to semiconductor wafers. In addition to the operations taught herein, the teachings herein may be used to perform physical measurements (such as topography measurements), film stress, surface damage, and/or surface charge. Therefore, it is intended that this invention encompass all variations and modifications as fall within the scope of the appended claims.

What is claimed is:

1. A method for measuring a substrate, the method comprising the steps of:
   (a) positioning a substrate within a measurement system having a substrate chuck and a measurement head mounted onto an arm, the combination of the substrate chuck and the arm having radial control and rotational control so that the measurement head may be cylinderically placed at various points adjacent the substrate;
   (b) rotating the substrate with respect to the measurement head by rotating the substrate chuck to a measurement position and simultaneously rotating the measurement head with respect to the arm;
   (c) measuring a substrate characteristic at the measurement position using the measurement head; and
   (d) processing zero or more measurement positions by repeating steps (b) through (d) a finite number of times for the substrate.

2. The method of claim 1 wherein the step (c) comprises:
measuring the substrate to find a particle count at the measurement position using the measurement head.

3. The method of claim 1 wherein the step (c) comprises:
directing a laser beam at the measurement position using the measurement head.

4. The method of claim 1 wherein the step (c) comprises:
measuring a thickness of a film at the measurement position using the measurement head.

5. The method of claim 1 wherein the step (c) comprises:
measuring a resistivity of a film layer on the substrate at the measurement position using the measurement head.

6. The method of claim 1 wherein the step (c) comprises:
measuring a dopant concentration of the substrate at the measurement position using the measurement head.

7. The method of claim 1 wherein the step (c) comprises:
providing electromagnetic radiation at the measurement position using the measurement head.

8. The method of claim 1 wherein the step (b) comprises:
moving the substrate chuck using the radial control to arrive at the measurement position.

9. The method of claim 1 wherein the step (a) comprises:
positioning the substrate wherein the substrate is a substrate having a diameter greater than or equal to 300 mm.

10. The method of claim 1 wherein the step (b) comprises:
rotating a position of a plurality of measurement head on the arm within the measurement system.

11. The method of claim 1 wherein the step (a) comprises:
providing the measurement system wherein the measurement system contains a plurality of measurement heads wherein each measurement head in the plurality of measurement heads performs a same type of characteristic measurement on different measurement positions on the substrate in an overlapping time period.

12. The method of claim 1 wherein the step (a) comprises:
providing the measurement system wherein the measurement system contains a plurality of measurement heads wherein each measurement head in the plurality of measurement heads performs a different type of characteristic measurement on different measurement positions on the substrate in an overlapping time period.

13. A method for measuring a wafer, the method comprising the steps of:
   (a) positioning a wafer within a measurement system having a substantially stationary wafer chuck, a measurement arm, and a measurement head mounted to the measurement arm, the measurement arm having radial control and rotational control to allow the measurement head to be positioned over any measurement point on the wafer;
   (b) rotating the measurement arm with respect to the wafer to rotate the measurement arm into a measurement position;
   (c) measuring a wafer characteristic at the measurement position using the measurement head; and
   (d) processing zero or more measurement positions by repeating steps (b) through (d) a finite number of times for the wafer.

14. The method of claim 13 wherein the step (c) comprises:

measuring the wafer to find a particle count at the measurement position using the measurement head.

15. The method of claim 13 wherein the step (c) comprises:

directing a laser beam at the measurement position using the measurement head.

16. The method of claim 13 wherein the step (c) comprises:

measuring a thickness of a film at the measurement position using the measurement head.

17. The method of claim 13 wherein the step (c) comprises:

measuring a resistivity of a film layer on the wafer at the measurement position using the measurement head.

18. The method of claim 13 wherein the step (c) comprises:

measuring a dopant concentration of the wafer at the measurement position using the measurement head.

19. The method of claim 13 wherein the step (c) comprises:

providing electromagnetic radiation at the measurement position using the measurement head.

20. The method of claim 13 wherein the step (b) comprises:

moving the measurement arm using the radial control to arrive at the measurement position.

21. The method of claim 13 wherein the step (a) comprises:

positioning the wafer wherein the wafer is a wafer having a diameter greater than or equal to 300 mm.

22. The method of claim 13 wherein the step (b) comprises:

rotating a position of the measurement head on the measurement arm within the measurement system.

23. The method of claim 13 wherein the step (a) comprises:

providing the measurement system wherein the measurement system contains a plurality of measurement heads wherein each measurement head in the plurality of measurement heads performs a same type of characteristic measurement on different measurement positions on the wafer in an overlapping time period.

24. The method of claim 13 wherein the step (a) comprises:

providing the measurement system wherein the measurement system contains a plurality of measurement heads wherein each measurement head in the plurality of measurement heads performs a different type of characteristic measurement on different measurement positions on the wafer in an overlapping time period.

25. A method for measuring a wafer, the method comprising the steps of:
 (a) positioning a wafer within a measurement system having a wafer chuck, a measurement arm, and a measurement head mounted to the measurement arm, the measurement arm having radial control and the wafer chuck having rotational control to allow the measurement head to be positioned over any measurement point on the wafer;
 (b) rotating the wafer chuck with respect to the measurement head by rotating the wafer chuck while moving the measurement arm in a radial direction and while moving the test head;
 (c) measuring a wafer characteristic across the wafer using the measurement head; and
 (d) processing zero or more measurement positions by repeating steps (b) through (d) a finite number of times for the wafer.

26. The method of claim 25 wherein the step (c) comprises:

measuring the wafer to find a particle count at the measurement position using the measurement head.

27. The method of claim 25 wherein the step (c) comprises:

directing a laser beam at the measurement position using the measurement head.

28. The method of claim 25 wherein the step (c) comprises:

measuring a thickness of a film at the measurement position using the measurement head.

29. The method of claim 25 wherein the step (c) comprises:

measuring a resistivity of a film layer on the wafer at the measurement position using the measurement head.

30. The method of claim 25 wherein the step (c) comprises:

measuring a dopant concentration of the wafer at the measurement position using the measurement head.

31. The method of claim 25 wherein the step (c) comprises:

providing electromagnetic radiation at the measurement position using the measurement head.

32. The method of claim 25 wherein the step (b) comprises:

moving the measurement arm using the radial control to arrive at the measurement position while rotating the test head.

33. The method of claim 25 wherein the step (a) comprises:

positioning the wafer wherein the wafer is a wafer having a diameter greater than or equal to 300 mm.

34. The method of claim 25 wherein the step (b) comprises:

rotating a position of the measurement head proportional to the rotation of the wafer chuck on the measurement arm within the measurement system to enable measurement of the wafer characteristic.

35. The method of claim 25 wherein the step (a) comprises:

providing the measurement system wherein the measurement system contains a plurality of measurement heads wherein each measurement head in the plurality of measurement heads performs a same type of characteristic measurement on different measurement positions on the wafer in an overlapping time period.

36. The method of claim 25 wherein the step (a) comprises:

providing the measurement system wherein the measurement system contains a plurality of measurement heads wherein each measurement head in the plurality of measurement heads performs a different type of characteristic measurement on different measurement positions on the wafer in an overlapping time period.

37. A method for measuring a wafer, the method comprising the steps of:
 providing a wafer to a wafer system having a plurality of measurement heads wherein each measurement head in the plurality of measurement heads rotates on a measurement arm to achieve rotational alignment;
 enabling positioning means within the wafer system to perform rotational orientation and radial orientation of the wafer with respect to the measurement heads; and measuring a wafer characteristic from the wafer using the measurement heads.

38. The method of claim 37 wherein each measurement head in the plurality of measurement heads performs a same type of characteristic measurement on different measurement positions on the wafer in an overlapping time period.

39. The method of claim 37 wherein each measurement head in the plurality of measurement heads performs a different type of characteristic measurement on different measurement positions on the wafer in an overlapping time period.

40. The method of claim 37 wherein the step (c) comprises:

measuring the wafer to find a particle count at the measurement position using the measurement head.

41. The method of claim 37 wherein the step (c) comprises:

directing a laser beam at the measurement position using the measurement head.

42. The method of claim 37 wherein the step (c) comprises:

measuring a thickness of a film at the measurement position using the measurement head.

43. The method of claim 37 wherein the step (c) comprises:

measuring a resistivity of a film layer on the wafer at the measurement position using the measurement head.

44. The method of claim 37 wherein the step (c) comprises:

measuring a dopant concentration of the wafer at the measurement position using the measurement head.

45. The method of claim 37 wherein the step (c) comprises:

providing electromagnetic radiation at the measurement position using the measurement head.

\* \* \* \* \*